United States Patent
Tanimoto et al.

(10) Patent No.: US 7,538,309 B2
(45) Date of Patent: May 26, 2009

(54) IMAGE PICKUP APPARATUS

(75) Inventors: Takashi Tanimoto, Motosu-gun (JP); Takayuki Sato, Kochi (JP)

(73) Assignees: Sanyo Electric Co., Ltd., Moriguchi (JP); Sanyo Semiconductor Co., Ltd., Ora-gun (JP); National University Corporation, Kochi (JP)

( * ) Notice: Subject to any disclaimer, the term of this patent is extended or adjusted under 35 U.S.C. 154(b) by 0 days.

(21) Appl. No.: 12/010,717

(22) Filed: Jan. 29, 2008

(65) Prior Publication Data

US 2008/0251694 A1 Oct. 16, 2008

(30) Foreign Application Priority Data

Feb. 5, 2007 (JP) .............................. 2007-025191

(51) Int. Cl.
*H01L 27/00* (2006.01)
(52) U.S. Cl. .............. 250/208.1; 250/226; 250/339.02; 348/273
(58) Field of Classification Search .............. 250/208.1, 250/226, 339.02, 370.08; 348/273, 290, 348/342, 333.08
See application file for complete search history.

(56) References Cited

U.S. PATENT DOCUMENTS

2008/0111894 A1* 5/2008 Tanimoto ................. 348/222.1

FOREIGN PATENT DOCUMENTS

JP A 10-325798 12/1998

* cited by examiner

*Primary Examiner*—Kevin Pyo
(74) *Attorney, Agent, or Firm*—Oliff & Berridge, PLC

(57) ABSTRACT

An image pickup apparatus capable of capturing a composite image of a visible-light image and an infrared image of a subject is provided, whereby the configuration is simplified and made more convenient. A visible-light source (20) and an excitation-light source (22) for exciting a phosphorescent substance are provided as a light source (6) for a subject that includes an infrared-fluorescent substance. The light from the subject is passed through an optical filter (10) and directed into a CCD image sensor (12). The optical filter (10) cuts excitation light and transmits fluorescent light. The transmittance of visible light by the optical filter (10) is set lower than the transmittance of fluorescent light so that the weak infrared image from the fluorescent light is clearly displayed over the visible-light image. Since the CCD image sensor (12) is sensitive to infrared light as well as to visible light, an image signal is outputted for the composite image according to the incident light from the optical filter (10).

4 Claims, 4 Drawing Sheets

IMAGE PICKUP APPARATUS

CROSS-REFERENCE TO RELATED APPLICATION

The priority application number JP2007-025191 upon which this patent application is based is hereby incorporated by the reference.

BACKGROUND OF THE INVENTION

1. Field of the Invention

The present invention relates to an image pickup apparatus capable of capturing a composite image of a visible-light image and an infrared image from an infrared fluorescent substance.

2. Description of the Related Art

Phosphors are utilized in techniques for detecting the structure of an object that is not apparent in a visible-light image, or for detecting the presence of a specific substance within an object. For example, the microscope instrumentation disclosed in Japanese Laid-open Patent Application No. 10-325798 is used to observe a biological tissue sample in which an antibody bonded with a phosphor referred to as indocyanine green (ICG hereinafter) is used as a probe. This microscope instrumentation detects the presence of minute cancers in the biological tissue sample through the observation of phosphorescence generated from the probe, which has the property of easily accumulating in the cancer tissue.

ICG is a dye that absorbs and is excited by near-infrared light having a wavelength of approximately 800 nm, and fluoresces to emit near-infrared light of approximately 850 nm. ICG can be administered to the human body as a contrast medium, and the infrared light images obtained through the use of ICG are used to diagnose and treat illnesses. For example, an image of a blood vessel can be observed by injecting ICG into the blood vessel. Liver functioning is tested using the property of ICG whereby ICG binds to proteins in the blood, and is selectively taken into the livers.

In surgery and the like, the physician must be able to visually monitor the operating site. During surgery, it is sometimes preferable for an image to be obtained in which the position of a blood vessel on or under the surface of the operating site can be monitored, in addition to the usual image obtained as a visible-light image. From this perspective, there is a need for an image (infrared composite image) in which an infrared image obtained through the use of a fluorescent contrast medium is synthesized with a visible-light image.

An image pickup apparatus capable of capturing a visible-light image and an infrared image is necessary in order to generate an infrared composite image. A CCD image sensor or other solid-state image sensor is sensitive not only to visible light, but also to near-infrared light. Therefore, a solid-state image sensor may be used to capture the infrared composite image.

In this regard, in the abovementioned microscope instrumentation, a dichroic mirror is used that reflects the excitation light of the ICG and transmits the fluorescence of the ICG to reflect the excitation light emitted from a light source towards the test sample, and the fluorescent component among the fluorescent component and the excitation light component included in the light from the sample is selectively transmitted and directed into the solid-state image sensor. In the microscope instrumentation, the dichroic mirror is set so as to reflect a portion of the visible light and transmit the rest so that the visible-light image is observed at the same time as the infrared image from the phosphor. In this arrangement, the reflectance and transmittance of visible light are each set to 50%, whereby, theoretically, the percentage of the visible light emitted from the light source that reaches the solid-state image sensor can be maximized. In this regard, the intensity of the visible light that reaches the solid-state image sensor from the sample in the maximized state is 25% of the intensity that could be obtained if the visible light from the light source were to be directly radiated to the sample without passing through the dichroic mirror, and the reflected light allowed to directly enter the solid-state image sensor.

The apparatus disclosed in Japanese Laid-open Patent Application No. 10-325798 is known as an apparatus for enabling simultaneous observation of a visible-light image and an infrared image, but this apparatus is a microscope instrumentation, and it is not always possible to apply this configuration to observation of an operating site during surgery, or to other imaging applications. For example, in surgery, it is sometimes necessary to maintain a relatively large space for surgical maneuvering around the surgical operating site, or to maintain a space for enabling the surgeon to directly see the operating site during surgery. In such cases, it can be difficult to maintain the necessary space for an image pickup apparatus that has constituent elements near the object being imaged. An image pickup apparatus used to observe a surgical site is preferably configured so that the arrangement of the imaging means or the illumination means has a high degree of freedom with respect to the observed object in order to enable imaging from an arbitrary position that does not obstruct the surgical operation.

SUMMARY OF THE INVENTION

The present invention relates to an image pickup apparatus capable of capturing a composite image of a visible-light image and an infrared image of a subject, and an object of the present invention is to provide a configuration for an image pickup apparatus that is simple and highly convenient.

The image pickup apparatus according to the present invention comprises a light source for emitting first-component light in a visible-light spectrum, and second-component light having an excitation wavelength of an infrared-fluorescent substance, toward a subject that includes the infrared-fluorescent substance for emitting infrared fluorescent light; an optical filter for transmitting the infrared fluorescent light and a spectral component that corresponds to the first-component light among light from the subject, and preventing transmission of a spectral component that corresponds to the second-component light; a solid-state image sensor capable of capturing a visible-light image and an infrared image on the basis of transmitted light of the optical filter; and a signal processing circuit for processing a signal read from each photoreceptor pixel of the solid-state image sensor and generating an image signal that represents a composite image based on the visible-light image and the infrared image.

DESCRIPTION OF THE PREFERRED EMBODIMENTS

Specific embodiments (hereinafter referred to as embodiments) of the present invention will be described below based on the accompanying drawings.

Figure 1:
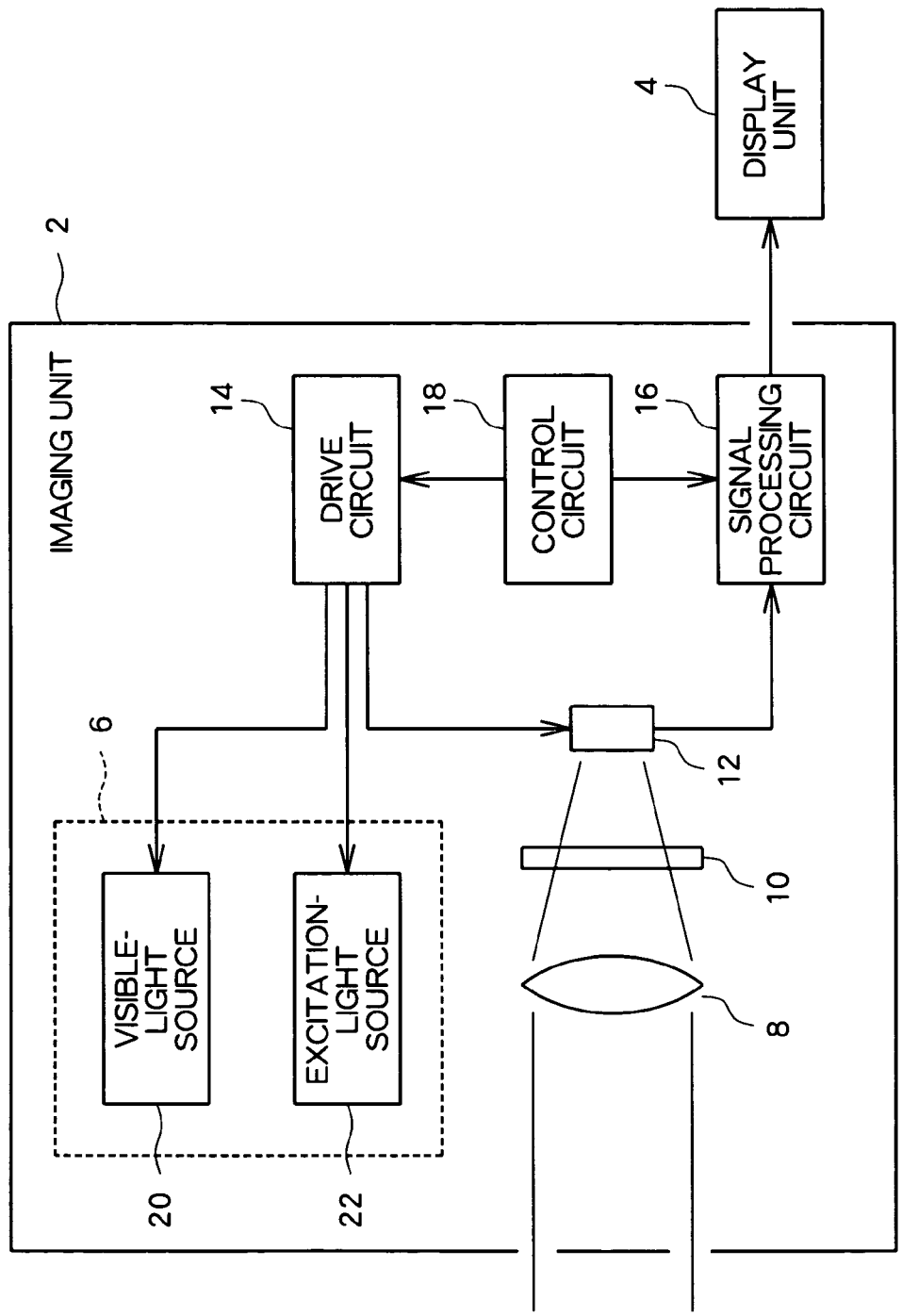
FIG. 1 is a block diagram showing the general configuration of the image pickup apparatus according to an embodiment of the present invention.

The present embodiment is an image pickup apparatus used in surgery, for example, for capturing a composite image of a visible-light image and an infrared image from a human body or other subject in which ICG is intravascularly administered as a fluorescent contrast medium. FIG. 1 is a block diagram showing the general structure of the image pickup apparatus according to the present embodiment. The image pickup apparatus is divided into an imaging unit 2 and a display unit 4, for example, and the imaging unit 2 includes a light source 6, an optical system 8, an optical filter 10, a CCD image sensor 12, a drive circuit 14, a signal processing circuit 16, and a control circuit 18.

The light source 6 is composed of a visible-light source 20 for emitting visible light in a relatively wide spectrum that extends over the colors of R (red), G (green), and B (blue), and an excitation-light source 22 for emitting light in a relatively narrow spectrum that includes the excitation wavelength of ICG. A xenon lamp, a white LED (Light Emitting Diode), or the like, for example, may be used as the visible-light source 20. According to the excitation wavelength of ICG, an LED having a peak wavelength of 780 nm, or another semiconductor luminescent device, for example, may be used as the excitation-light source 22. A GaAs-based laser diode (LD) or other laser diode in particular as a device for emitting light in the 780 nm band is used to read a CD (Compact Disc), and this laser diode may also be employed in the present apparatus. The light source 6 preferably has minimal luminescence components near the fluorescence wavelength, in order to clearly image the phosphorescence generated by the ICG. In this respect, since the emission spectrum of the white LED has a reduced intensity in the infrared region, the white LED may be used alone. When a light source such as a xenon lamp having a relatively high intensity of light emitted in the infrared region is used as the visible-light source 20, an infrared blocking filter is used to remove the infrared spectrum component that includes the phosphorescence wavelength.

The light from the subject is received in the image pickup apparatus via the optical system 8. The optical system 8 is composed of a lens and other components, and forms an optical image on the light-receiving surface of the CCD image sensor 12.

Figure 2:
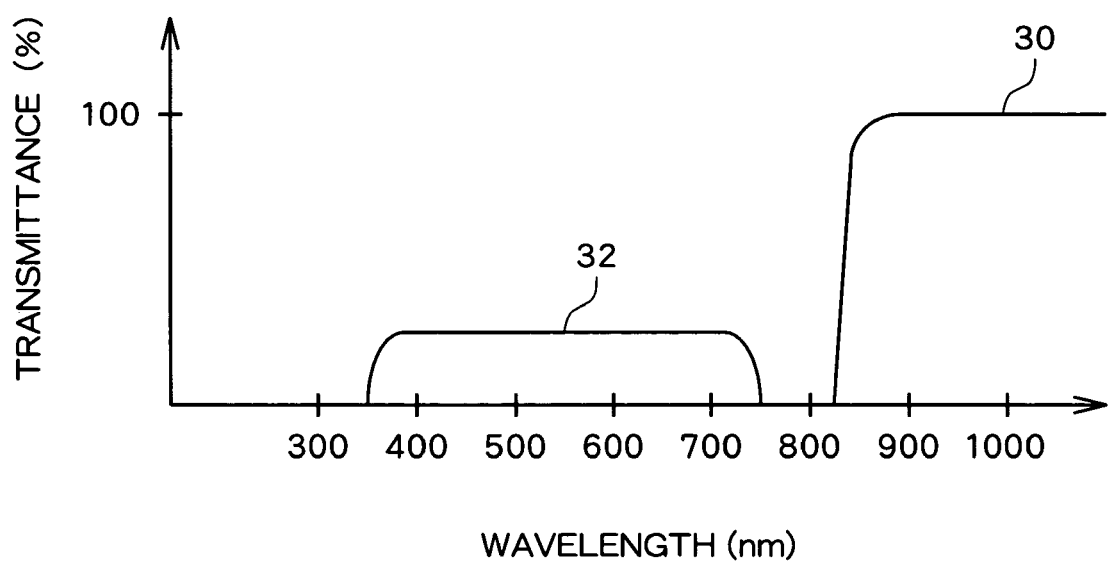
FIG. 2 is a schematic diagram showing the spectral transmission characteristics of the optical filter.

The optical filter 10 is disposed on the path of light that is incident on the CCD image sensor 12. FIG. 2 is a schematic view showing the spectral transmission characteristics of the optical filter 10. The optical filter 10 has characteristics 30 whereby transmission of light in the region near the excitation wavelength of 780 nm is suitably prevented, whereas light in the region near the fluorescence wavelength of 850 nm is suitably transmitted. Through this configuration, an extraneous image created by excitation light reflected by the subject is prevented from being captured in the CCD image sensor 12, and the infrared image due to fluorescence can be suitably captured.

Figure 4:
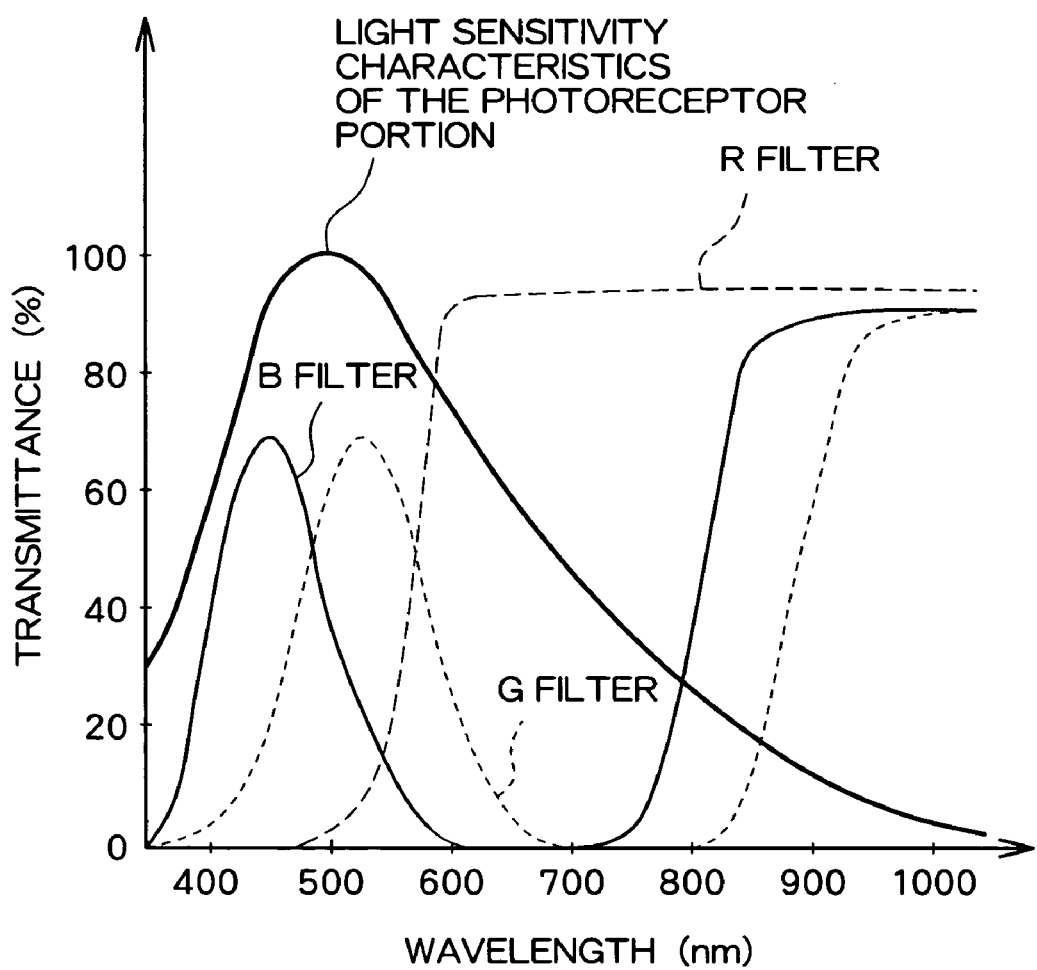
FIG. 4 is a graph showing the spectral transmission characteristics of the RGB filters and the spectral sensitivity characteristics of the photodiodes.

In addition, the optical filter 10 has characteristics 32 whereby visible light is also transmitted. A difference is provided between the transmittance in the visible-light region and the transmittance in the infrared region. This difference in transmittance is adjusted before the difference in intensity between the visible light and the infrared fluorescent light from the subject is allowed to enter the CCD image sensor 12, and is set so that the desired synthesis balance is obtained between the visible-light image and the infrared image in the composite image. Specifically, since the fluorescent light generated by the ICG is generally weak, and the spectral sensitivity characteristics in the infrared region of the CCD image sensor 12 are lower than those of the visible-light region, as shown in FIG. 4 described hereinafter, the intensity of the infrared image on the composite image can be relatively increased, and a clear display can be obtained by setting the transmission characteristics 32 in the visible-light region of the optical filter 10 to a lower transmittance than the transmission characteristics 30 in the infrared region.

In this regard, such characteristics of the optical filter 10 as those described herein can be obtained by forming a thin film in which about 10 to 60 layers of silica or titania are repeatedly deposited by vacuum deposition, for example.

Figure 3:
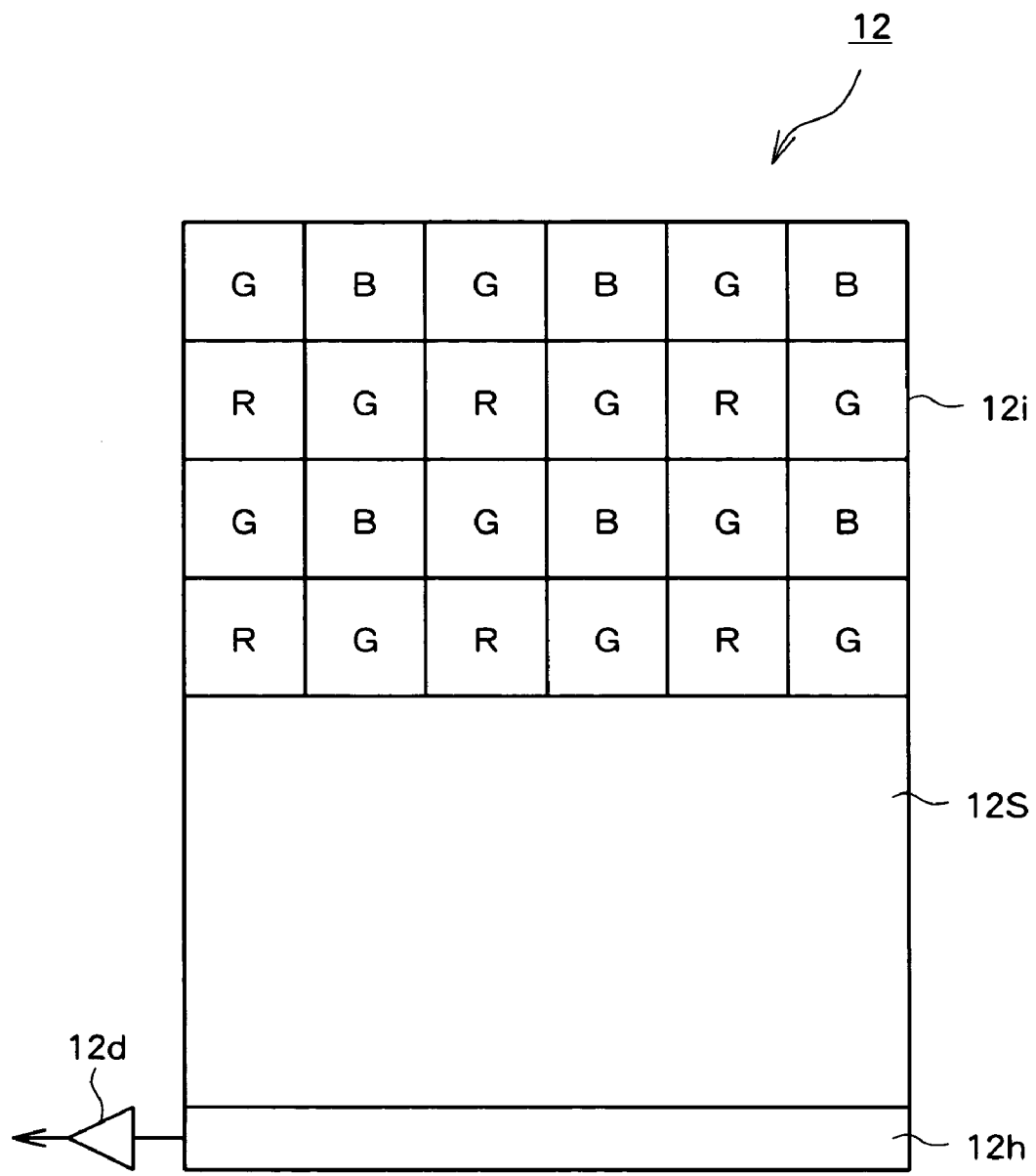
FIG. 3 is a schematic plan view showing the general configuration of the CCD image sensor.

The CCD image sensor 12 operates based on various types of clock signals from the drive circuit 14, and generates an image signal in accordance with the subject. FIG. 3 is a schematic plan view showing the general configuration of the CCD image sensor 12. The CCD image sensor 12 shown in FIG. 3 is a frame-transfer CCD, and is configured so as to include an imaging part 12$i$, a storage part 12$s$, a horizontal transfer part 12$h$, and an output part 12$d$ that are formed on a semiconductor substrate.

Each bit of the vertical shift registers that constitute the imaging part 12$i$ functions as a photoreceptor pixel that constitutes a pixel. In the photoreceptor pixels, color filters are arranged, and a light component to which a photoreceptor pixel is sensitive is determined according to the transmission characteristics of each color filter. A Bayer color filter array is provided in the imaging part 12$i$.

The color filters are formed from a colored organic material, for example, and transmit the corresponding color of visible light, but due to the material properties thereof, infrared light is also transmitted. For example, FIG. 4 is a schematic graph showing the spectral transmission characteristics of the RGB filters. FIG. 4 also shows the spectral sensitivity characteristics of the photodiode. The transmittance of each color of color filter shows specific spectral characteristics according to each color in the visible-light region, but the spectral characteristics are substantially the same for each color in the infrared region.

The photodiode is sensitive in the entire visible-light region to a wavelength of about 780 nm, as well as to the near-infrared region of light having wavelengths longer than about 780 nm. Therefore, when an infrared component is incident on the photoreceptor pixels, the infrared component passes through the color filters and generates a signal charge in the photodiode. Specifically, in each photoreceptor pixel, a signal charge that is in accordance with a visible-light component that corresponds to the color of the color filter arranged on the particular pixel among the incident light, and a signal charge that is in accordance with an infrared component are synthesized and accumulated.

The signal charges generated in the photoreceptor pixels of the imaging part 12$i$ are transferred to the output part 12$d$ via the storage part 12$s$ and the horizontal transfer part 12$h$. The output part 12$d$ is composed of an electrically isolated capacitor and an amplifier for extracting the potential variation thereof. The signal charges outputted from the horizontal transfer part 12$h$ are received in the capacitor in one-bit units and converted to voltage values, and are outputted as time-series image signals.

The drive circuit 14 receives a timing control signal or the like from the control circuit 18, generates various types of clock signals for driving the CCD image sensor 12, and feeds the clock signals to the CCD image sensor 12. The drive circuit 14 receives an instruction from the control circuit 18, and turns the light source 6 on and off in accordance with the imaging operation by the CCD image sensor 12, for example.

The signal processing circuit 16 generates an image signal indicating a composite image in which the visible-light image and the infrared image are synthesized, on the basis of the image signal outputted by the CCD image sensor 12. The signal processing circuit 16 includes an analog signal processing circuit, an A/D conversion circuit, and a digital signal processing circuit.

The analog signal processing circuit performs amplification, sample-and-hold, and other processes for the image signal of the analog signal outputted by the output part 12*d*. The A/D conversion circuit converts the image signal outputted from the analog signal processing circuit into digital data having a prescribed number of quantization bits, and thereby generates and outputs image data.

The digital signal processing circuit receives the image data from the A/D conversion circuit and performs various processes. For example, the digital signal processing circuit filters the RGB data that are sampled in the RGB photoreceptor pixels. In the filtration process, the RGB data obtained at different sampling points are interpolated, and through this interpolation, RGB data are defined in each sampling point that constitutes the image. Random noise or pixel defects are also removed during in the filtration process. The filtered RGB data are indicated as [R], [G], and [B].

The digital signal processing circuit uses [R], [G], and [B] to perform a routine for generating an image signal that indicates the composite image, and generates luminance data (luminance signal) Y and color difference data (color difference signals) Cr, Cb at each sampling point. For example, Y, Cr, and Cb are computed based on the following equations.

$$Y = \alpha[R] + \beta[G] + \gamma[B] \quad (1)$$

$$Cr = \lambda([R] - Y) \quad (2)$$

$$Cb = \mu([B] - Y) \quad (3)$$

In these equations, $\alpha$, $\beta$, $\gamma$, $\lambda$, and $\mu$ are coefficients, and the following relationship exists between $\alpha$, $\beta$, and $\gamma$ in particular.

$$\alpha + \beta + \gamma = 1 \quad (4)$$

The [R], [G], and [B] include a visible-light component and an infrared fluorescent-light component from the subject, and the following equation is established when the signal components corresponding to the original R, G, and B components included in the light incident on the CCD image sensor 12 are designated as $R_0$, $G_0$, and $B_0$, and the signal components corresponding to the infrared light that is superimposed thereon are designated as Ir, Ig, and Ib.

$$[R] = R_0 + Ir$$

$$[G] = G_0 + Ig$$

$$[B] = B_0 + Ib \quad (5)$$

The color filters arranged in the RGB photoreceptor pixels as described above have basically the same spectral characteristics in the infrared region, and Ir, Ig, and Ib are about the same. When Eqn. (6) below is written to simplify the description, Eqn. (5) becomes as indicated in Eqn. (7).

$$Ir = Ig = Ib = [IR] \quad (6)$$

$$[R] = R_0 + [IR]$$

$$[G] = G_0 + [IR]$$

$$[B] = B_0 + [IR] \quad (7)$$

When Eqns. (4) and (7) are used, the Y, Cr, and Cb shown in Eqns. (1) through (3) are indicated as follows.

$$Y = \alpha R_0 + \beta G_0 + \gamma B_0 + [IR] \quad (8)$$

$$Cr = \gamma\{(1-\alpha)R_0 - \beta G_0 - \gamma B_0 - [IR]\} \quad (9)$$

$$Cb = \mu\{-\alpha R_0 - \beta G_0 + (1-\gamma)B_0 - [IR]\} \quad (10)$$

Eqn. (8) indicates that the luminance signal Y obtained by the signal processing circuit 16 is the sum of the component [IR] of the infrared fluorescent light and the luminance value when the infrared component is not incident. Specifically, the brightness of an image signal of the composite image generated by the signal processing circuit 16 increases according to the intensity of the infrared fluorescent light.

The image signal of the composite image generated in the signal processing circuit 16 is inputted to the display unit 4, and an image is displayed in a liquid crystal display or other display device. For example, when ICG is injected into a blood vessel and surgery is performed, a composite image is obtained in which an infrared image in which the blood vessels and the like stand out in white in response to the ICG concentration is synthesized with a visible-light image of the surgical site as indicated by a color image corresponding to $R_0$, $G_0$, and $B_0$.

The balance between the visible-light image and the infrared image in the composite image can be set in advance to a prescribed state according to the transmission characteristics of the optical filter 10, as described above. The transmittance in the visible-light spectrum and the transmittance in the infrared spectrum of the optical filter 10 can be freely adjusted so as to create the desired synthesis balance in the composite image. For example, the adjustment can be performed by replacing the optical filter 10. Furthermore, in the present apparatus, the intensities of light generated by the visible-light source 20 and the excitation-light source 22 can each be independently controlled, and by adjusting the balance of the intensities of generated light, the balance between the visible-light image and the infrared image in the composite image can be variably controlled. Specifically, the drive circuit 14 increases and decreases the light source voltage and current fed to the visible-light source 20 and the excitation-light source 22 in accordance with the control of the control circuit 18, and the intensities of light generated by the light sources 20, 22 are adjusted.

A configuration may also be adopted in which the visible light and the excitation light are fed from a common light source. In this case, the intensities of generated light cannot be independently controlled, e.g., the relative intensity of generated light of the visible light with respect to the excitation light may be fixed. However, even in this case, the balance of the composite image can be adjusted by adjusting the characteristics of the optical filter 10 as described above. Particularly in the configuration of the present invention, the intensity of visible light that passes through the optical filter 10 and reaches the CCD image sensor 12 can be freely adjusted in the range of 0 to 100% of the intensity of the visible light reflected by the subject.

The imaging unit 2 may also be integrated within a single housing, for example, and the imaging unit 2 may be disposed in any position that can be made to face the subject. The imaging unit 2 may be placed relatively distant from the subject, e.g., a working space or the like for surgery may be maintained. A configuration may also be adopted in which the light source 6 in the imaging unit 2 can be disposed separate from another configuration of the imaging unit 2, or an additional illumination means that is the same as the light source 6 may be provided. The display unit 4 may also be integrated with the imaging unit 2, or connected separately by a cable or the like.

As described above, the present apparatus is capable of capturing an infrared composite image in which the visible-light image and the infrared image are synthesized at the desired balance using a single CCD image sensor 12, and without the need for a plurality of solid-state image sensors. Misalignment between the visible-light image and the infrared image is thereby prevented. The configuration in which imaging is performed using a single solid-state image sensor does not require a dichroic mirror or other optical device for spatially separating the incident light from the subject into a visible-light component and an infrared component. Therefore, attenuation of the fluorescent light by the optical device can be prevented, and increased sensitivity to the infrared fluorescent light can be obtained. Furthermore, in the configuration composed of a single solid-state image sensor, the fact that there is no need for the abovementioned optical device for spatial separation into a visible-light component and an infrared component means that reduced size of the image pickup apparatus can be anticipated. Reducing the size of the device enhances the convenience of the device and makes the device less likely to obstruct the work of surgery or the like when used.

The solid-state image sensor used in the image pickup apparatus of the present invention is not limited to the CCD image sensor 12 described above. For example, a CMOS image sensor may also be used in the image pickup apparatus of the present invention.

According to the present invention, the light generated from the light source can be directly radiated to the subject without modification. The light from the subject can also be direct into the solid-state image sensor without separation into a visible-light component and an infrared fluorescent light component. Furthermore, the solid-state image sensor is a single body, and detects the visible-light component and the infrared component. In other words, according to the present invention, there is no need for a structure for reflecting/refracting or branching into light paths from the light source to the subject, and from the subject to the solid-state image sensor. Therefore, the degree of freedom of the arrangement of the light source and the solid-state image sensor is increased, and a space can easily be maintained between the subject and the light source and solid-state image sensor. The structure is therefore simplified, and convenience is enhanced.

What is claimed is:

1. An image pickup apparatus comprising:
   a light source for emitting first-component light in a visible-light spectrum, and second-component light having an excitation wavelength of an infrared-fluorescent substance, toward a subject that includes the infrared-fluorescent substance for emitting infrared fluorescent light;
   an optical filter for transmitting the infrared fluorescent light and a spectral component that corresponds to the first-component light among light from the subject, and preventing transmission of a spectral component that corresponds to the second-component light;
   a solid-state image sensor capable of capturing a visible-light image and an infrared image on the basis of transmitted light of the optical filter; and
   a signal processing circuit for processing a signal read from each photoreceptor pixel of the solid-state image sensor and generating an image signal that represents a composite image based on the visible-light image and the infrared image.

2. The image pickup apparatus according to claim 1, wherein the solid-state image sensor is a color image sensor in which a plurality of types of color photoreceptor pixels having sensitivity to infrared light and specific colors of visible light is arranged in two dimensions.

3. The image pickup apparatus according to claim 1, wherein the optical filter has transmission characteristics for adjusting an intensity difference between the infrared fluorescent light and reflected light of the first-component light from the subject according to a desired synthesis balance between the visible-light image and the infrared image in the composite image.

4. The image pickup apparatus according to claim 1, wherein the light source comprises:
   a first light-generating part for generating the first-component light; and
   a second light-generating part for generating the second-component light; wherein
   light-generating intensities of the first light-generating part and the second light-generating part can each be independently controlled.

* * * * *